(12) United States Patent
Gedamu et al.

(10) Patent No.: US 6,765,295 B1
(45) Date of Patent: Jul. 20, 2004

(54) MULTIPLEXING SYSTEM AND METHOD FOR CROSSING SIGNALS ON A SINGLE METAL LAYER OF AN INTEGRATED CIRCUIT

(75) Inventors: Elias Gedamu, Calgary (CA); Denise Man, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/421,499

(22) Filed: Apr. 23, 2003

(51) Int. Cl.[7] .......................... H01L 23/48; H01L 23/52; H01L 29/40
(52) U.S. Cl. .................. 257/754; 257/211; 257/758
(58) Field of Search ................................ 257/211, 754, 257/758

(56) References Cited

U.S. PATENT DOCUMENTS

| | | | |
|---|---|---|---|
| 5,140,327 A | * | 8/1992 | Bruce et al. ................. 341/172 |
| 5,323,044 A | * | 6/1994 | Rumennik et al. .......... 257/379 |
| 6,160,276 A | * | 12/2000 | Mohsen ....................... 257/209 |

* cited by examiner

*Primary Examiner*—Ngân V. Ngô

(57) ABSTRACT

Systems and methods are described for sharing signals across a common metal trace on a single metal layer of an integrated circuit. The signals are time division multiplexed across the common metal trace such that a single metal layer of an integrated circuit is used to multiplex signals to and from a poly-silicon layer, reducing utilization of upper metal layers of the integrated circuit.

19 Claims, 6 Drawing Sheets

MULTIPLEXING SYSTEM AND METHOD FOR CROSSING SIGNALS ON A SINGLE METAL LAYER OF AN INTEGRATED CIRCUIT

BACKGROUND

A complex integrated circuit is constructed of a plurality of interconnected layers. Typically, a poly-silicon layer containing logic circuitry utilizes one or more metal layers for interconnectivity, particularly where a signal requires a path of lower resistance instead of traversing across the poly-silicon layer. The metal layers have contacts on inner surfaces that mate with adjoining layers to complete inter-layer electrical circuits.

The inter-layer electrical circuits create certain design complexities during the design phase of the integrated circuit. More particularly, in the design phase, the integrated circuit is divided into blocks, each block providing certain design functionality. For example, a first block may provide memory cache functionality, and a second block may provide arithmetic processing functionality. These blocks often utilize one or more metal layers of the integrated circuit design. Circuitry within the first block then interacts with circuitry of the second block, requiring signal routing therebetween and across a first metal layer. This routing may require that a trace route through a third block in order to reach the second block; however, if one trace is already routed through the third block, it may not be possible to route a second trace through that third block if the second trace crosses the first trace on the first metal layer. Accordingly, the second trace is then routed through a second metal layer of the integrated circuit on order to reach its destination in the second block. This routing creates certain difficulties in the construction of the integrated circuit as extra connectors are required, increasing complexity and congestion in lower metal layers and increasing the size and cost of the final integrated circuit.

SUMMARY

In one aspect, a system multiplexes signals on a single metal layer of an integrated circuit of the type constructed from a poly-silicon layer and at least a first metal layer. A common trace exists with the first metal layer. First and second multiplexing circuits connect and disconnect a first signal of the integrated circuit to and from the common trace. Third and fourth multiplexing circuits connect and disconnect a second signal of the integrated circuit to and from the common trace. The multiplexing circuits respond to a control signal such that the first and second multiplexing circuits connect the first signal to the common trace when the third and fourth multiplexing circuits disconnect the second signal from the common trace, and such that the first and second multiplexing circuits disconnect the first signal from the common trace when the third and fourth multiplexing circuits connect the second signal to the common trace.

In another aspect, the first, second, third and fourth multiplexing circuits are disposed with the poly-silicon layer; a plurality of connectors couple between the first, second, third and fourth multiplexing circuits and the first metal layer.

In one aspect, the control signal is a common clock signal of the integrated circuit. Those skilled in the art appreciate that the control signal may be separately generated to control the multiplexing circuits in like manner.

In another aspect, an apparatus multiplexes signals across a common trace (e.g., within a printed circuit board or within an integrated circuit). First and second multiplexing circuits connect and disconnect a first signal to and from the common trace. Third and fourth multiplexing circuits connect and disconnect a second signal to and from the common trace, the multiplexing circuits respond to a control signal such that the first and second multiplexing circuits connect the first signal to the common trace when the third and fourth multiplexing circuits disconnect the second signal from the common trace and such that the first and second multiplexing circuits disconnect the first signal from the common trace when the third and fourth multiplexing circuits connect the second signal to the common trace.

In one example, a printed circuit board includes the apparatus, with the common trace being constructed within a single layer of the printed circuit board. The multiplexing circuits are for example constructed and arranged with the single layer or with another layer of the printed circuit board.

In another example, an integrated circuit includes the apparatus. The integrated circuit has a poly-silicon layer and one or more metal layers. The common trace is constructed within a single metal layer of the integrated circuit. The multiplexing circuits are constructed and arranged within the poly-silicon layer.

In yet another aspect, a method multiplexes a first signal and a second signal across a common trace, including the steps of: activating or deactivating a first pair of multiplexing circuits electrically coupled with the common trace; and activating or deactivating a second pair of multiplexing circuits electrically coupled with the common trace, such that only one of the first and second signals couples with the common trace at any one time.

As appreciated by those skilled in the art, any number of additional signals may be coupled across the common trace. By way of example, the method may include the further step of activating or deactivating one or more additional pairs of multiplexing circuits electrically coupled with the common trace to multiplex one or more additional signals across the common trace, such that only one of the first, second, or one of the additional signals couples with the common trace at any one time.

DETAILED DESCRIPTION

Figure 1:
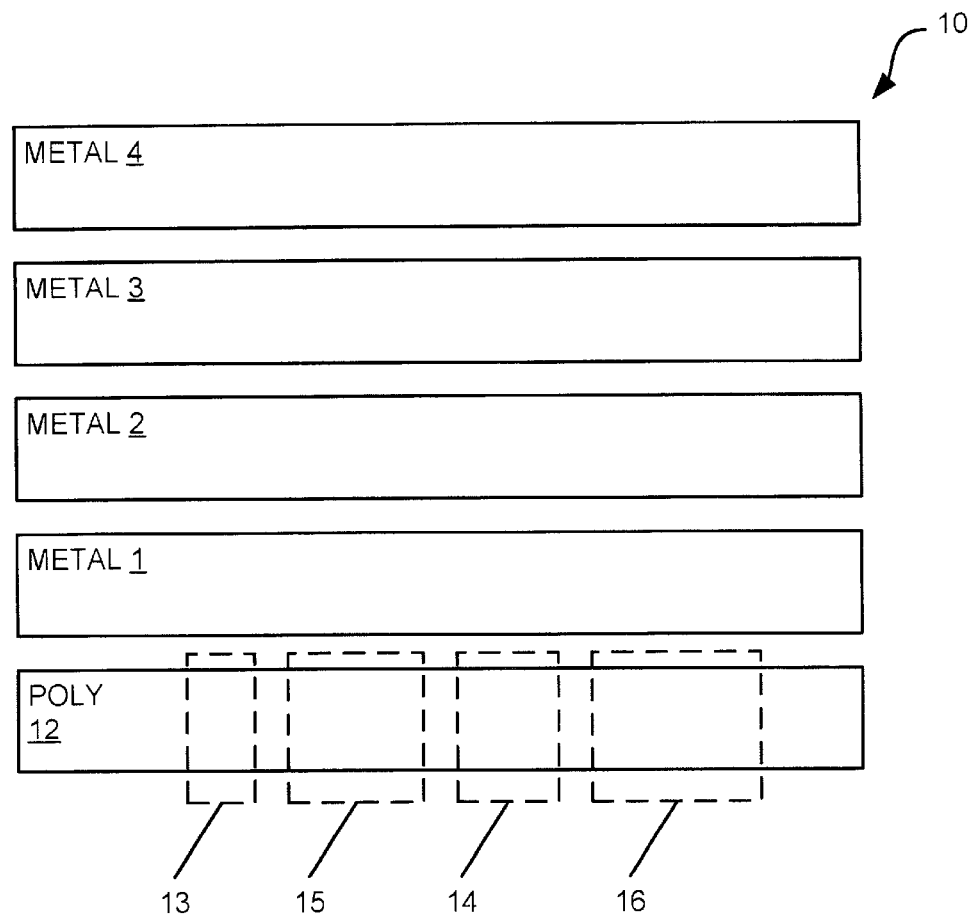
FIG. 1 is a block diagram showing a side view of one multi-layered integrated circuit.

FIG. 1 is a block diagram showing a multiple layered construction of an integrated circuit design 10. Integrated circuit 10 has one poly-silicon layer 12 (poly 12) and four metal layers, metal 1, metal 2, metal 3 and metal 4. In a design phase, integrated circuit 10 may be divided into design blocks, 13, 14, 15 and 16, each block providing certain design functionality for integrated circuit 10. For example, block 13 may provide memory cache functionality, block 14 may provide arithmetic processing functionality, block 15 may provide instruction pipe-lining functionality, and block 16 may provide flash memory functionality. Each design block 13, 14, 15 and 16 may utilize one or more metal layers 1–4 to route signals within integrated circuit 10. Block 14 is illustratively shown in a central area of integrated circuit 10 in FIG. 2.

Figure 2:
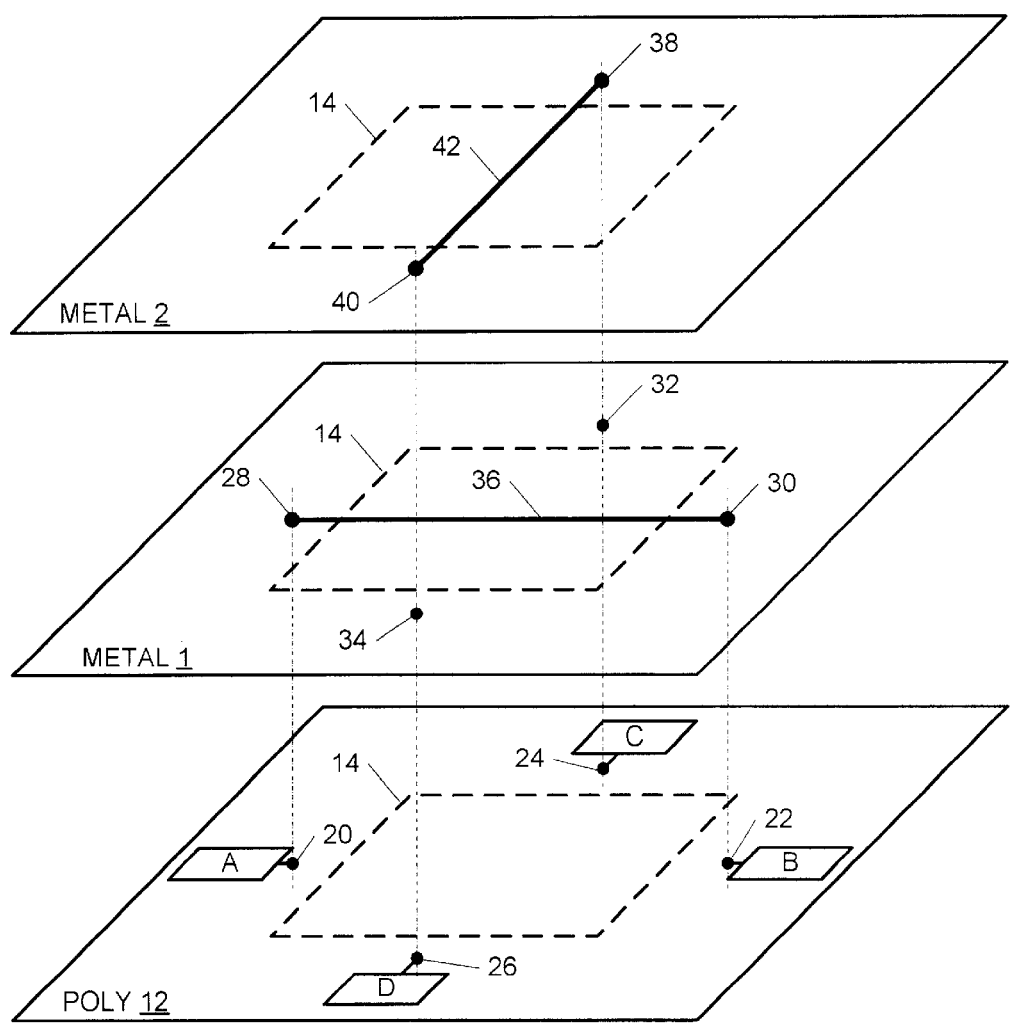
FIG. 2 shows a three dimensional view of an integrated circuit with two crossing signals routed through one design block utilizing two metal layers.
Figure 3:
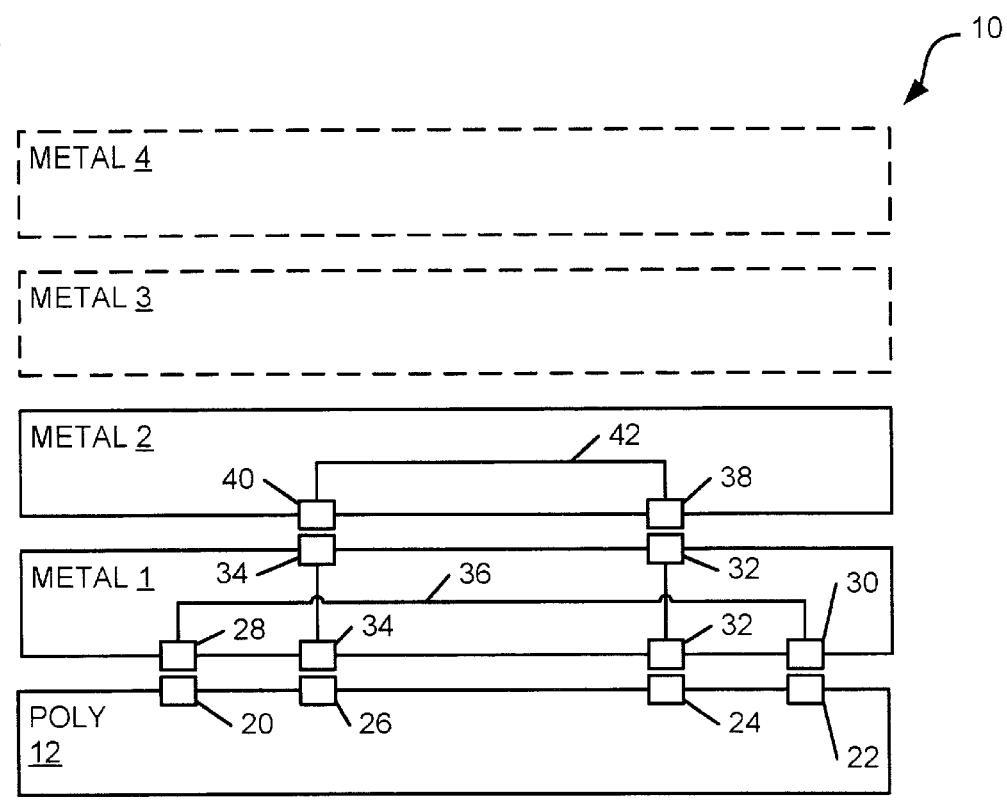
FIG. 3 shows a side view of the integrated circuit of FIG. 2 with multiple metal layers providing connectivity to a poly-silicon layer.

FIG. 2 shows a three dimensional representation of three layers, poly 12, metal 1 and metal 2, of integrated circuit 10. Poly 12 includes four points of interconnected circuitry, A, B C and D. Point A connects to point B across block 14 using metal 1; point C connects to point D across block 14 using metal 2. Design block 14 uses metal layers 1 and 2 when routing signals (e.g., from A to B, from C to D) across large areas of poly 12 to reduce electrical resistance involving long traces. As shown in FIG. 3, poly 12 utilizes pads to connect to contacts on metal layer 1; metal layers interconnect by other similar contacts.

By way of example, considering FIG. 2 and FIG. 3, point A connects to a pad 20 that provides connectivity to a corresponding contact 28 on metal 1. Likewise, points B, C and D have pads 22, 24 and 26 that provide connectivity to corresponding contacts 30, 32 and 34 on metal 1, respectively. Metal 1 has a metal trace 36 that connects between contacts 28 and 30, thereby connecting pad 20 to pad 22 of poly 12 and providing signal connectivity between points A and B. Contacts 32 and 34 of metal 1 connect with pads 24 and 26 of poly 12. However, as metal trace 36 already connects between contacts 28 and 30, to cross block 14 on metal 1, an additional metal layer is needed to connect between contacts 32 and 34 (assuming that additional connectivity (not shown) on metal 1 prevents trace routing around block 14). Metal 2 has contacts 38 and 40 that connect to contacts 32 and 34 of metal 1, respectively. Metal trace 42 connects between contacts 38 and 40 on metal 2, thereby connecting between contacts 32 and 34 on metal 1, pads 24 and 26 on poly 12, and providing signal connectivity between point C and point D.

The use of metal 2 in this example, to route a signal from point C to point D across block 14, may further prevent use of metal 2 by other design blocks. This adds significant time and cost to the development of integrated circuit 10. It also decreases reliability of integrated circuit 10 as connectors 38 and 40 add complexity and signal resistance to integrated circuit 10.

Figure 4:
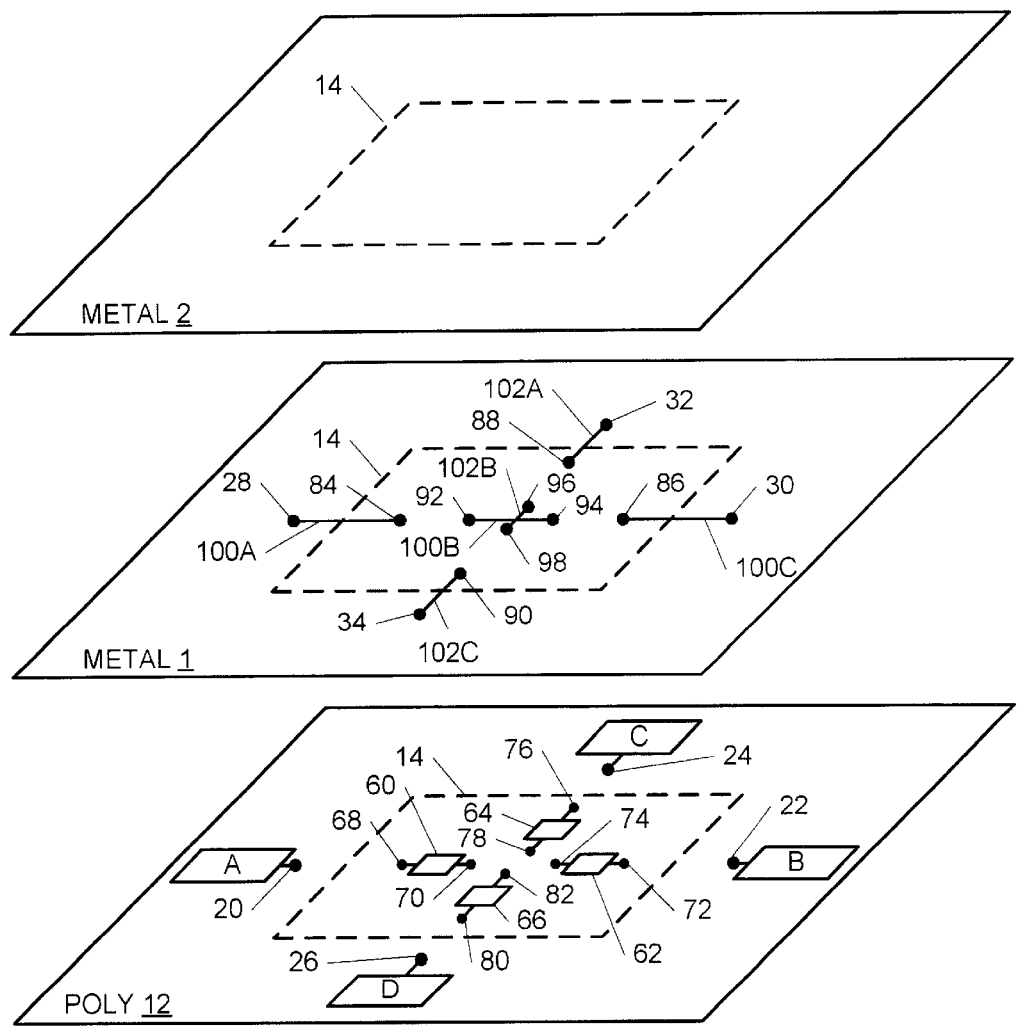
FIG. 4 shows a three dimensional view of an integrated circuit with two crossing signals routed through a single metal layer of one design block.

FIG. 4 shows one embodiment of multiplexing two signals across a single metal layer (metal 1) to permit communication between points A, B, C and D without using a second metal layer (metal 2). Point A uses pad 20 to connect to contact 28 on metal 1. A trace 100 traverses block 14 from contact 28 to contact 30. Contact 30 connects with pad 22 of point B on poly 12. Trace 100 is illustrated as three sections 100A, 100B and 100C.

Point C uses pad 24 to connect to contact 32 on metal 1. A trace 102 traverses block 14 from contact 32 to contact 34 on metal 1. Contact 34 connects with pad 26 of point D on poly 12. Trace 102 is illustrated as three sections 102A, 102B and 102C. Section 100B and section 102B are joined where traces 100 and 102 cross on metal 1.

Traces 100, 102 on metal 1 are multiplexed through operation of multiplexing circuits 60, 62, 64 and 66 on poly 12, such that signals on traces 100 and 102 time-share joined sections 100B and 102B. Multiplexing circuits 60 and 62 complete the circuit of trace 100 through contacts 84, 92, 94 and 86 and pads 68, 70, 74 and 72, as shown. Multiplexing circuits 64 and 66 complete the circuit of trace 102 through contacts 88, 96, 98 and 90, and pads 76, 78, 82 and 80, as shown.

Accordingly, in this example, point A communicates with point B through pad 20, contact 28, trace section 100A, contact 84, pad 68, multiplexing circuit 60, pad 70, contact 92, trace 100B, contact 94, pad 74, multiplexing circuit 62, pad 72, contact 86, trace 100C, contact 30 and pad 22. Point C communicates with point D through pad 24, contact 32, trace 102A, contact 88, pad 76, multiplexing circuit 64, pad 78, contact 96, trace 102B, contact 98, pad 82, multiplexing circuit 66, pad 80, contact 90, trace 102C, contact 34 and pad 26.

In operation, multiplexing circuits 60 and 62 control signal access from point A to point B, and multiplexing circuits 64 and 66 control signal access from point C to point D, such that only one signal is active across sections 100B and 102B at any one time. Metal layer 2 is not used in this example and is therefore available for use by other design blocks (e.g., blocks 13, 14 FIG. 1).

Figure 5:
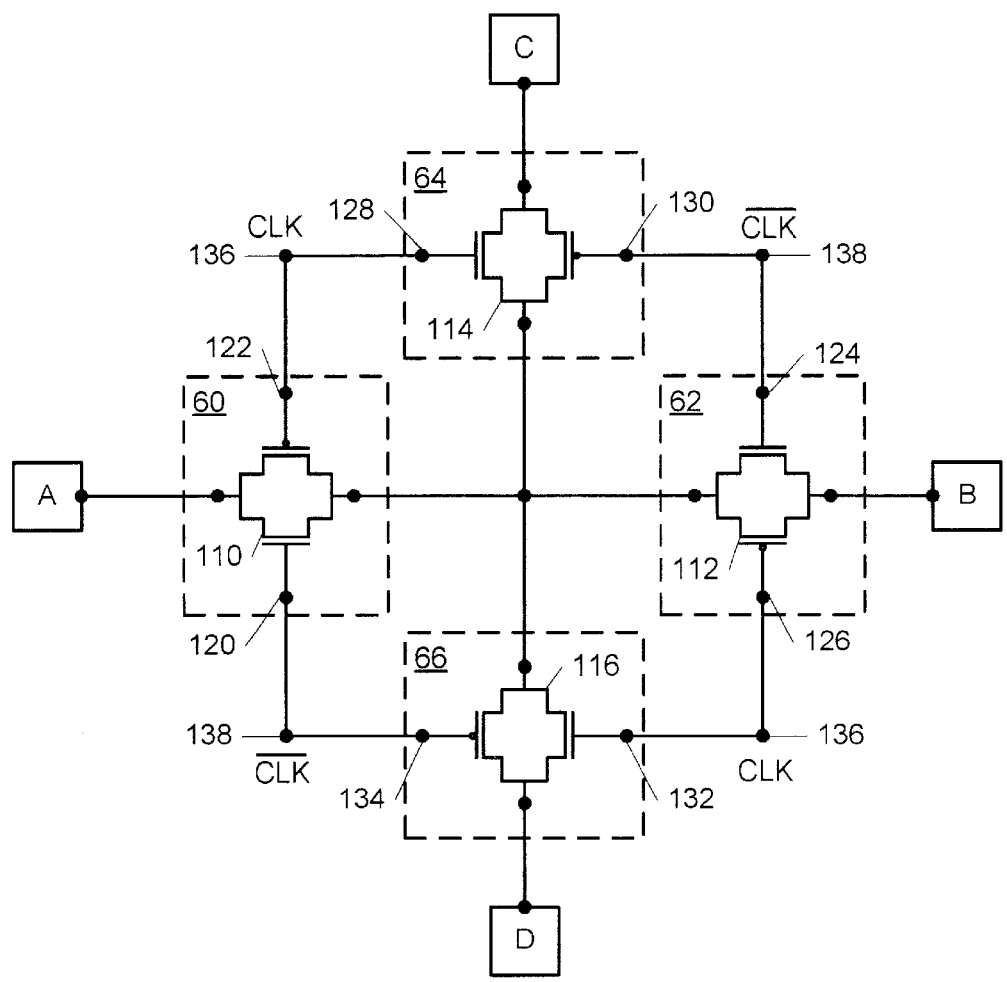
FIG. 5 is a schematic diagram illustrating one circuit that provides for signal-sharing on a single metal layer.

FIG. 5 is a schematic diagram illustrating one embodiment of a multiplexing circuit for crossing signals on a single metal layer of an integrated circuit. A single clock signal controls multiplexing circuits 60, 62, 64 and 66 to share electrically connected traces 100B and 102B on metal 1, from point A to point B, or from point C to point D, FIG. 4. Multiplexing circuits 60, 62, 64 and 66 have respective single pass gates 110, 112, 114, and 116. Pass gate 110 is controlled by control signals 120 and 122; pass gate 112 is controlled by control signals 124 and 126; pass gate 114 is controlled by control signals 128 and 130; and pass gate 116 is controlled by controlled signals 132 and 134.

In one example, to enable a signal from point A to point B, control signals 120 and 124 are high and control signals 122 and 126 are low. To disable a signal from point C to point D, control signals 128 and 132 are low and control signals 130 and 134 are high. To enable a signal from point C to point D, control signals 128 and 132 are high and control signal 130 and 134 are low. To disable a signal from point A to point B, control signals 120 and 124 are low and control signals 122 and 126 are high.

Control signals 122, 126, 128 and 132 are connected to a clock signal 136; and control signals 120, 124, 130 and 134 are connected to inverted clock signal 138. Clock signal 136 and inverted clock signal 138 thereby control pass gates 110, 112, 114 and 116 such that a signal from point A to point B and a signal from point C to point D are not simultaneously enabled.

Table 1 illustrates the connectivity of signals between points A and B and point C and D as controlled by clock signal 136 and inverted clock signal 138. This time-sharing across metal 1 avoids the need to route signals across metal 2, and increases available space on metal layer 2 for other design connectivity.

TABLE 1

| | Signal Connectivity | |
|---|---|---|
| CLK | A to B | C to D |
| 0 | CONNECTED | DISCONNECTED |

TABLE 1-continued

Signal Connectivity

| CLK | A to B | C to D |
|---|---|---|
| 1 | DISCONNECTED | CONNECTED |

Figure 6:
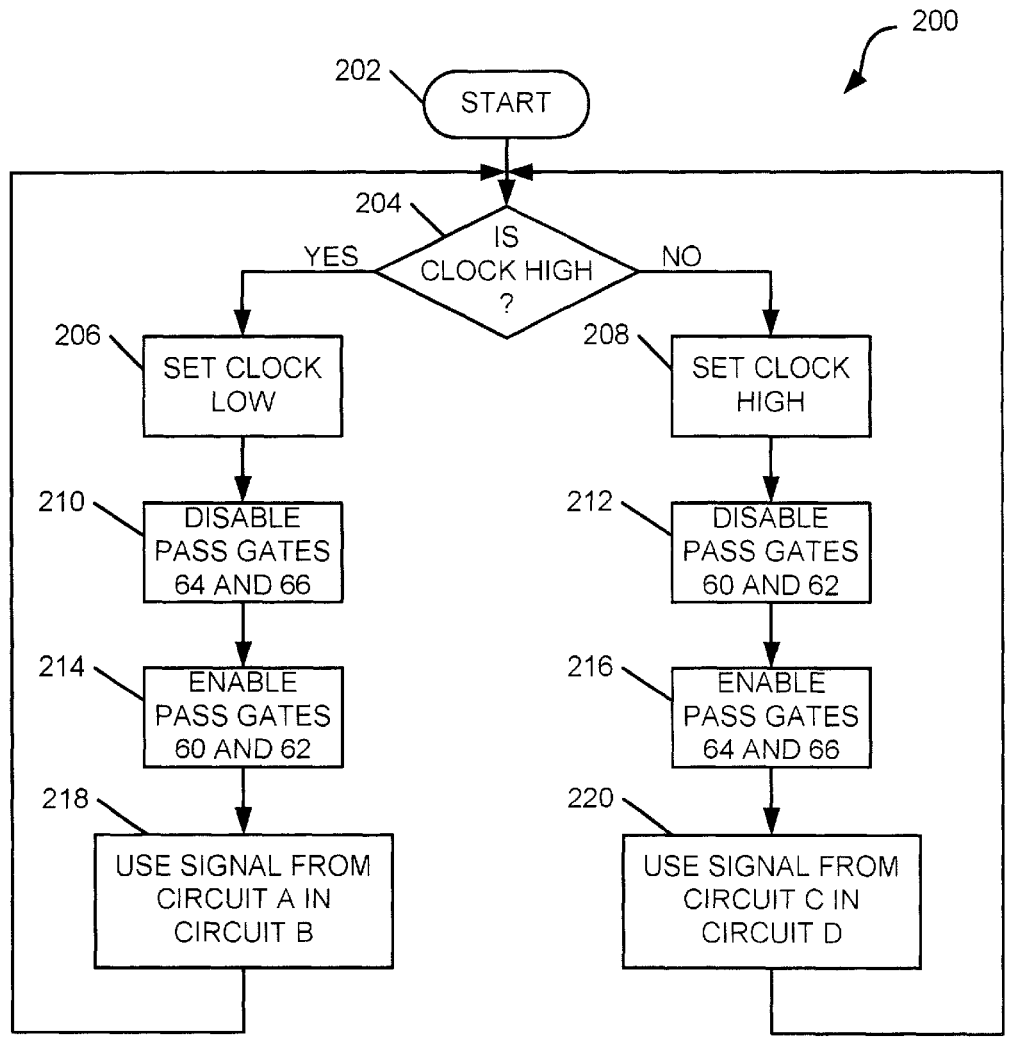
FIG. 6 is a flowchart illustrating one process for controlling the time division multiplexing of two signals across a single metal layer.

FIG. 6 is a flow chart illustrating one process 200 that time-multiplexes a signal from point A to point B and a signal from point C to point D across a single metal layer of an integrated circuit design. Process 200 starts at step 202 and continues with step 204.

Step 204 is a decision. If clock signal 136 is high, process 200 continues with step 206; otherwise process 200 continues with step 208.

Step 206 sets clock signal 136 to low. When clock signal 136 is low, a signal from point A is connected to point B, and a signal from point C to point D is disconnected. Process 200 continues with step 210.

Step 208 sets clock signal 136 to high. When clock signal 136 is high, a signal from point C is connected to point D, and a signal from point A to point B is disconnected. Process 200 continues with step 212.

Step 210 allows point B to use the signal from point A as this signal is currently enabled and the signal from point C to point D is disabled. Process 200 continues with step 204.

Step 212 allows point D to use the signal from point C as this signal is currently enabled, and the signal from point A to point B is disabled. Process 200 continues with step 204.

Process 200 may continue indefinitely, toggling the state of clock signals 136 and 138, thereby routing signals from point A to point B, and alternately from point C to point D.

Multiplexing circuits 60, 62, 64 and 66 need not be co-located on poly 12, but may be located as a matter of design convenience with other circuitry. In one example, multiplexing circuit 60 is located at point A, multiplexing circuit 62 is located at point B, multiplexing circuit 64 is located at point C and multiplexing circuit 66 is located at point D, such that metal 1 is not used except for sections 100B and 102B.

The example of FIG. 5 illustrates two signals multiplexed across a single junction using a single clock control signal. Those skilled in the art will appreciate that this may be extended to include a plurality of signals crossing a single metal layer by utilizing two pass gates for each signal and by controlling the pass gate pairs by multiple timing signals, such that signals at the single junction are not enabled simultaneously. This technique may also be applied to other layered electronic systems, such as printed circuit boards, where multiple layers are used for signal routing between components.

Changes may be made in the above methods and systems without departing from the scope hereof. It should thus be noted that that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A system for multiplexing signals on a single metal layer of an integrated circuit of the type constructed from a poly-silicon layer and at least a first metal layer, comprising:

a common trace within the first metal layer;

first and second multiplexing circuits for connecting and disconnecting a first signal of the integrated circuit to and from the common trace; and third and fourth multiplexing circuits for connecting and disconnecting a second signal of the integrated circuit to and from the common trace;

each of the multiplexing circuits responsive to a control signal such that the first and second multiplexing circuits connect the first signal to the common trace when the third and fourth multiplexing circuits disconnect the second signal from the common trace and such that the first and second multiplexing circuits disconnect the first signal from the common trace when the third and fourth multiplexing circuits connect the second signal to the common trace.

2. The system of claim 1, the first, second, third and fourth multiplexing circuits being disposed with the poly-silicon layer, and further comprising a plurality of connectors between the first, second, third and fourth multiplexing circuits and the first metal layer.

3. The system of claim 1, the control signal comprising a common clock signal of the integrated circuit.

4. The system of claim 1, each of the first and second multiplexing circuits comprising a pass gate responsive to the control signal to connect and alternatively disconnect the first signal to the common trace, each of the third and fourth multiplexing circuits comprising a pass gate responsive to the control signal to connect and alternatively disconnect the second signal to the common trace.

5. Apparatus for multiplexing signals across a common trace, comprising:

first and second multiplexing circuits for connecting and disconnecting a first signal to and from the common trace; and third and fourth multiplexing circuits for connecting and disconnecting a second signal to and from the common trace;

the multiplexing circuits responsive to a control signal such that the first and second multiplexing circuits connect the first signal to the common trace when the third and fourth multiplexing circuits disconnect the second signal from the common trace, and such that the first and second multiplexing circuits disconnect the first signal from the common trace when the third and fourth multiplexing circuits connect the second signal to the common trace.

6. The apparatus of claim 5, further comprising means for generating the control signal.

7. The apparatus of claim 6, the means for generating comprising a common clock.

8. The apparatus of claim 5, further comprising a printed circuit board, the common trace being constructed within a single layer of the printed circuit board.

9. The apparatus of claim 8, the multiplexing circuits being constructed and arranged with one of the single layer and another layer of the printed circuit board.

10. The apparatus of claim 5, further comprising an integrated circuit having a poly-silicon layer and one or more metal layers, the common trace being constructed within a single metal layer of the integrated circuit, the multiplexing circuits being constructed and arranged within the poly-silicon layer.

11. The apparatus of claim 5, the multiplexing circuits comprising a plurality of pass gates responsive to the control signal.

12. A method for multiplexing a first signal and a second signal across a common trace, comprising the steps of:

activating or deactivating a first pair of multiplexing circuits electrically coupled with the common trace; and activating or deactivating a second pair of multiplexing circuits electrically coupled with the common trace, such that only one of the first and second signals couples with the common trace at any one time.

13. The method of claim 12, the steps of activating or deactivating comprising utilizing a common clock to drive pass gates of the multiplexing circuits.

14. The method of claim 12, the steps of activating or deactivating comprising utilizing one or more control signals to drive pass gates of the multiplexing circuits.

15. The method of claim 12, the steps of activating or deactivating comprising utilizing a control signal on a poly-silicon layer of an integrated circuit, the common trace being within a metal layer of the integrated circuit.

16. The method of claim 12, further comprising activating or deactivating one or more additional pairs of multiplexing circuits electrically coupled with the common trace to multiplex one or more additional signals across the common trace, such that only one of the first, second, or one of the additional signals couples with the common trace at any one time.

17. A system for multiplexing signals on a single metal layer of an integrated circuit of the type constructed from a poly-silicon layer and at least a first metal layer, comprising:

a common trace within the first metal layer;

a first multiplexer pair comprising first and second multiplexing circuits; and a second multiplexer pair comprising third and fourth multiplexing circuits;

wherein each of the multiplexing circuits is responsive to a control signal such that the first multiplexer pair connect the first signal to the common trace when the second multiplexer pair disconnect the second signal from the common trace, and such that the first multiplexer pair disconnect the first signal from the common trace when the second multiplexer pair connect the second signal to the common trace.

18. A system for multiplexing signals on an integrated circuit of the type constructed from a poly-silicon layer and at least a first metal layer, comprising:

a common trace within the first metal layer;

a first multiplexer pair comprising first and second multiplexing circuits; and a second multiplexer pair comprising third and fourth multiplexing circuits;

wherein each of the multiplexer pairs is responsive to a control signal such that the first multiplexer pair connect the first signal to the common trace when the second multiplexer pair disconnect the second signal from the common trace.

19. The system of claim 18, wherein the first multiplexer pair disconnect the first signal from the common trace when the second multiplexer pair connect the second signal to the common trace.

* * * * *